United States Patent [19]
Wang et al.

[11] Patent Number: 5,583,077
[45] Date of Patent: Dec. 10, 1996

[54] INTEGRATED DUAL LAYER PASSIVATION PROCESS TO SUPPRESS STRESS-INDUCED METAL VOIDS

[75] Inventors: Jih H. Wang, Taipei; Jhih C. Ku; Yu Yu-Jen, both of Hsin-Chu, all of Taiwan

[73] Assignee: Taiwan Semiconductor Manufacturing Company Ltd, Hsin-Chu, Taiwan

[21] Appl. No.: 416,161

[22] Filed: Apr. 4, 1995

[51] Int. Cl.⁶ .................. H01L 21/316; H01L 21/318
[52] U.S. Cl. ............................. 437/240; 437/241
[58] Field of Search .......................... 437/240, 241

[56] References Cited

U.S. PATENT DOCUMENTS

| | | | |
|---|---|---|---|
| 4,455,325 | 6/1984 | Razouk | 427/85 |
| 5,139,971 | 8/1992 | Giridhar et al. | 437/195 |
| 5,336,640 | 8/1994 | Sato | 437/240 |

FOREIGN PATENT DOCUMENTS

| | | | |
|---|---|---|---|
| 57-028335 | 2/1982 | Japan | H01L 21/314 |
| 57-139930 | 8/1982 | Japan | H01L 21/31 |
| 04026765 | 1/1992 | Japan | H01L 21/205 |

OTHER PUBLICATIONS

Wolf, Stanley, "Silicon Processing For The VLSI Era", vol. 1, (1986) pp. 188–189, 332–333, 516–517.

Primary Examiner—R. Bruce Breneman
Assistant Examiner—Matthew Whipple
Attorney, Agent, or Firm—George O. Saile

[57] ABSTRACT

Integrated circuits may be passivated by means of two deposited layers—one of phosphosilicate glass and one of silicon nitride. It was observed that if significant time elapsed between the deposition of the phosphosilicate and the silicon nitride, appreciable degradation of the underlying metallurgy, in the form of voids, occurred. This was traced to a change, over time, in the stresses to which the metallurgy was being subjected—from tensile to compressive. This problem has been solved in the present invention by the provision of a dry environment in which to store the integrated circuits between the application of the two passivation layers.

11 Claims, 2 Drawing Sheets

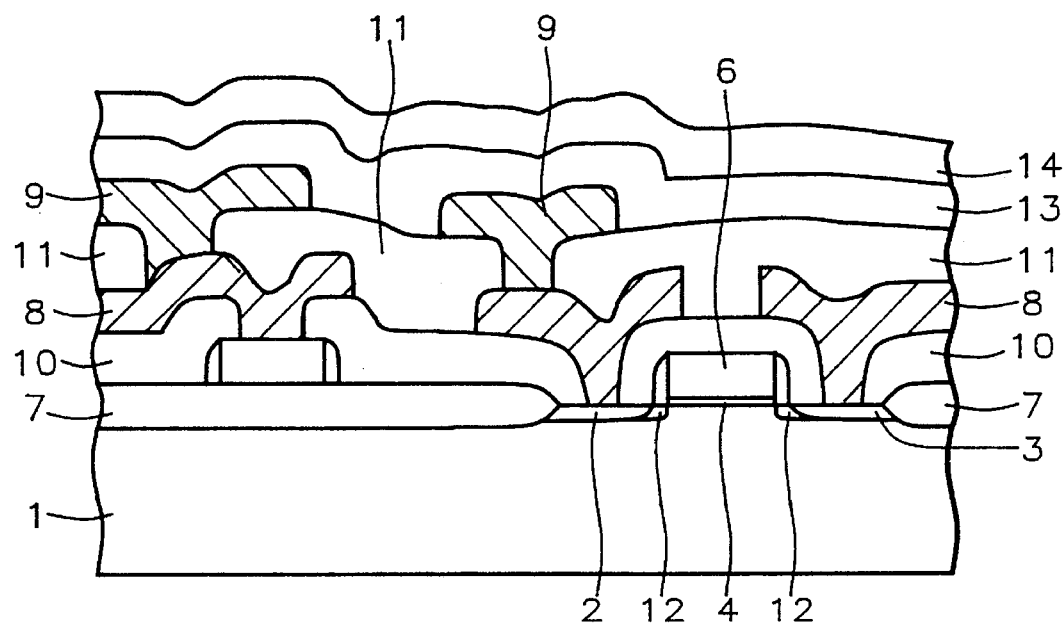
*FIG. 1 — Prior Art*
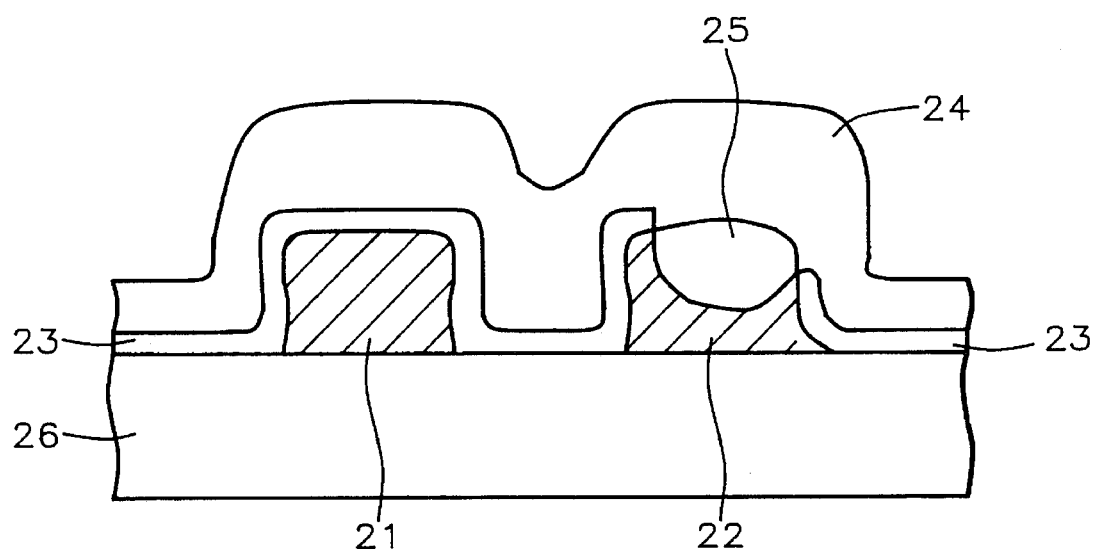
*FIG. 2*

INTEGRATED DUAL LAYER PASSIVATION PROCESS TO SUPPRESS STRESS-INDUCED METAL VOIDS

BACKGROUND OF THE INVENTION (1) Field of the Invention

The invention relates to the general field of semiconductor integrated circuits, more particularly to the passivation of such circuits and to stress-induced metal voids that may be formed during passivation.

(2) Description of the Prior Art

Once all the steps required to fabricate a working integrated circuit have been completed, there still remains the important step of passivating the circuit, that is protecting it from possible contamination during its operating lifetime. It is old in the art to use two deposited layers for this purpose—one (such as silicon nitride) as a barrier against external contaminants and a second (such as phosphosilicate glass) as a getter, or scavenger, to neutralize contaminants already present.

In the course of exercising this two layer procedure, several days may elapse between the two depositions. Failure of some of the product that had been subject to this delay between depositions was observed and was correlated with excessive exposure to moisture of the phosphosilicate glass layer prior to the application of the silicon nitride layer.

We were unable to find any prior art that relates to this phenomenon. Razouk (U.S. Pat. No. 4,455,325 June, 1984) discusses heating of phosphosilicate glass in a moist atmosphere for the purpose of partially reflowing phosphosilicate glass, the moisture being intentionally added as a necessary component of the environment in which the reflow occurs.

SUMMARY OF THE INVENTION

The object of this invention has been to provide a method for successfully passivating integrated circuits by means of successive coatings of phosphosilicate glass and silicon nitride, while still permitting significant time to elapse between the application of these coatings.

This has been achieved by introducing into the process the additional requirement that integrated circuits, after phosphosilicate glass application but before silicon nitride application, be stored in a low humidity environment. Additionally, a vacuum heat treatment may be provided just prior to the application of the silicon nitride.

BRIEF DESCRIPTION OF THE DRAWINGS

FIG. 1 is a cross-section through an integrated circuit, including double passivation layers.

FIG. 2 shows an example of a stress-induced void in a metallic layer.

DESCRIPTION OF THE PREFERRED EMBODIMENTS

Figure 3:
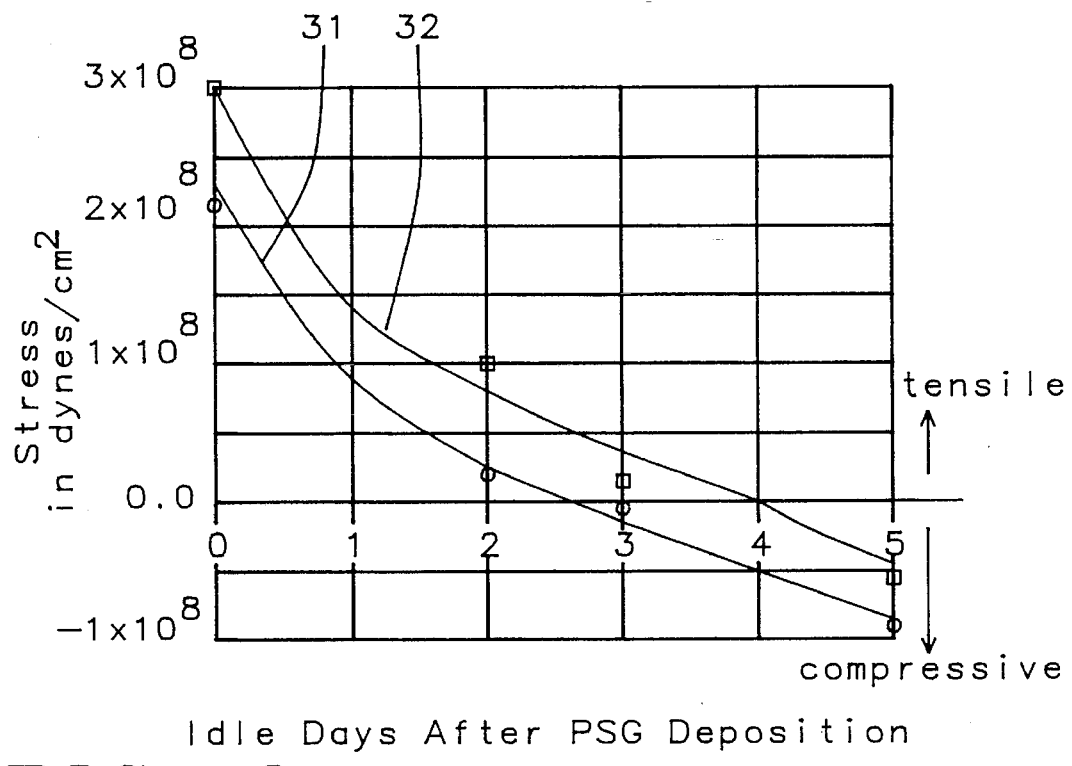
FIG. 3 shows curves of stress vs. time for two samples that have received a passivation layer of phosphosilicate glass.

FIG. 1 is a schematic cross-section through part of an integrated circuit. Numerous electronic components are formed within, and on the surface of, monocrystalline semiconductor substrate 1. By using techniques such as diffusion and ion implantation, in combination with patterning (that is, selective etching by means of photolithography), resistivity and conductivity type can be carefully controlled and limited to specific regions. This allows the creation of devices such as transistors, diodes, resistors, etc. An example of such a component is a field effect transistor whose source 2, drain 3, gate oxide 4, and gate electrode 6 are shown, together with insulating spacers 12. Components such as these are insulated from one another by means of thick layers of insulation (field oxide) such as 7.

To form electronic circuits, the components are connected together through conductive layers, such as 8 and 9, patterned so as to provide the right connections. Such conductive layers must be prevented from unintentionally touching one another or the various components and devices. This is done by providing insulating layers such as 10 and 11.

Once the above steps have been successfully implemented, an important final step is still required, namely passivating the integrated circuit in order to protect it from external sources of contamination during its operating lifetime. Many ways of providing such passivation are available. The method that we have found to be most effective for our needs is to coat the integrated circuit with two different layers. First, a layer of phosphosilcate glass (PSG) 13, comprising silicon oxide that contains between 3.5 and 5 atomic % phosphorus is deposited to a thickness between 4,500 and 5,500 Angstrom units. The preferred method for depositing the PSG is Atmospheric Pressure Chemical Vapor Deposition (APCVD).

Second, a layer of silicon nitride (SIN) is deposited to a thickness between 6,000 and 8,000 Angstrom units. The preferred method for depositing the silicon nitride is Plasma Enhanced Pressure Chemical Vapor Deposition (PECVD). The motivation for employing a two layer passivation process is that the SiN layer acts as an effective barrier against outside contaminants while the PSG layer acts to getter existing contaminants, such as sodium, already present within the integrated circuit.

As in any production line, a certain proportion of the product is found to be defective at the time it emerges from the end of the line. One such defect that was observed was a higher than expected incidence of open circuits in the aluminum silicide metallurgy that was in immediate contact with the passivation layers. Further investigation revealed that these open circuits were the result of metal voids that had appeared within said metallurgy. FIG. 2 (based on an actual microsection) shows an example of this. 21 and 22 are sections through two aluminum silicide stripes that had been deposited onto silicon substrate 26 and then coated with passivation layers 23 and 24 (comprising PSG and SiN respectively). Aluminum silicide stripe 22 had failed (open circuited) because of the presence of stress induced void 25.

It was further observed that this component of yield loss (metal void formation leading to open circuits) correlated with the length of time that elapsed between the application of the two passivating layers—the longer the delay the greater the yield loss. Unfortunately, for reasons relating to the economics of running an efficient production line, it is generally not feasible to apply the SiN immediately after the application of the PSG. In practice, several days often elapsed between the two applications.

Since compressive stress in the deposited layers was a possible cause of void formation in the aluminum silicide metallurgy, measurements were made of the stress as a function of time after deposition. Two different batches of silicon wafers received PSG coatings on day 0 and were then stored in a nitrogen atmosphere for 5 days. The stress in the deposited layers was measured each day, the results for two control wafers being shown in FIG. 3 as curves 31 and 32. As can be seen, stress was initially tensile, and of the order of $+2.5 \times 10^6$ dynes/cm.$^2$ but diminished each day, becoming negative (that is, compressive) after day 3.

Figure 4:
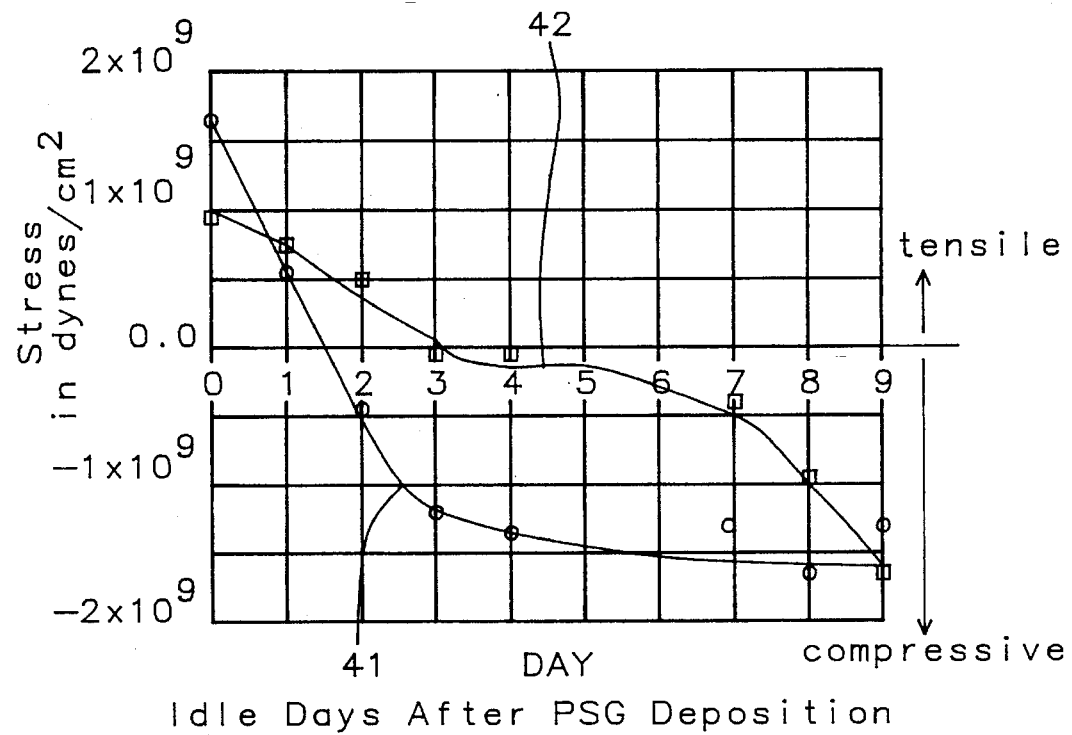
FIG. 4 shows curves of stress vs. time for two samples, one in a dry environment one in a moist one.

PSG layers of this type are known to be porous and capable of absorbing moisture from the atmosphere. Therefore, data similar to that shown in FIG. 3 was generated for samples that had been left in an environment that had a high moisture content. The results are shown in FIG. 4 as curve 41. Curve 42 shows results for samples created at the same time but stored in the moisture free nitrogen atmosphere used previously. Thus it is apparent that, in the presence of high humidity, the stress changes over, from tensile to compressive, very rapidly (less than 2 days) and continues to plunge, reaching compressive values of the order of $-1.5 \times 10^9$ dynes/cm.$^2$ after the third day. Stress in the samples that were left in the nitrogen environment (curve 42) did not become compressive until almost day 4 and they did not reach values around $-1.5 \times 10^9$ dynes/cm.$^2$ until about day 9.

These findings are the basis for the present invention which comprises keeping integrated circuit wafers in a dry environment from the time they are coated with a passivation layer of PSG until they are coated with SiN.

In a second embodiment of the invention, we have found it to be advantageous to introduce an additional procedure just prior to the application of the SiN. This additional procedure comprises baking the sample in a vacuum oven for 30 to 120 minutes at a temperature between 70° and 120° C. It should be noted that vacuum baking alone (without prior storage in the dry environment) does NOT lead to a reduction in void formation.

Incorporation of the invention into our own production line procedures has resulted in an improvement in our product yield as follows:

| ESTIMATED YIELD LOSS DUE TO VOID FORMATION IN AlSi CONDUCTORS: | |
| --- | --- |
| without benefit of the present invention | 90% |
| stored in dry atmosphere between PSG and SiN | 5% |
| stored in dry atmos. + vacuum bake just before SiN | 0% |

While the invention has been particularly shown and described with reference to the two preferred embodiments described above, it will be understood by those skilled in the art that various changes in form and details may be made without departing from the spirit and scope of the invention.

What is claimed is:

1. A method for reducing yield loss during the manufacture of an integrated circuit comprising:

(a) providing a monocrystalline semiconductor substrate;

(b) providing electronic components within, and on the surface of, said substrate by forming a plurality of regions of predetermined resistivity and conductivity type;

(c) connecting said electronic components to form electronic circuits by means of conductive layers deposited and then patterned on said components;

(d) providing at least one layer of insulation, located and patterned so as to prevent unintended electrical contact between said conductive layers, one to another, and between said conductive layers and said electrical components;

(e) depositing a passivation layer of phosphosilicate glass comprising silicon oxide containing between 3.5 and 5 atomic % phosphorus;

(f) storing said integrated circuit in a low humidity environment for less than five days, wherein the relative humidity in said low humidity environment is less than about 25%;

(g) heating said integrated circuit in vacuum for between 30 and 120 minutes at a temperature of between 70° and 120° C.; and (h) then depositing a passivation layer of silicon nitride.

2. The method of claim 1 wherein said monocrystalline semiconductor comprises silicon.

3. The method of claim 1 wherein at least one of said conductive layers comprises aluminum silicide.

4. The method of claim 1 wherein said heating in vacuum is performed for no longer than about 120 minutes prior to said deposition of silicon nitride.

5. The method of claim 1 wherein said layer of phosphosilicate glass is deposited by means of Atmospheric Pressure Chemical Vapor Deposition.

6. The method of claim 1 wherein said layer of silicon nitride is deposited by means of Plasma Enhanced Chemical Vapor Deposition.

7. The method of claim 1 wherein the thickness of said layer of phosphosilicate glass is between 4,500 and 5,500 Angstrom units.

8. The method of claim 1 wherein the thickness of said layer of silicon nitride is between 6,000 and 8,000 Angstrom units.

9. A method for suppressing stress-induced metal void formation in an integrated circuit comprising:

(a) providing a monocrystalline silicon substrate;

(b) providing electronic components within, and on the surface of, said substrate by forming a plurality of regions of predetermined resistivity and conductivity type;

(c) connecting said electronic components to form electronic circuits by means of conductive layers deposited and then patterned on said components;

(d) providing at least one layer of insulation, located and patterned so as to prevent unintended electrical contact between said conductive layers, one to another, and between said conductive layers and said electrical components;

(e) depositing a passivation layer of phosphosilicate glass comprising silicon oxide containing between 3.5 and 5 atomic % phosphorus;

(f) storing said integrated circuit in a low humidity environment for less than five days, wherein the relative humidity in said low humidity environment is less than about 25%;

(g) heating said integrated circuit in vacuum for between 30 and 120 minutes at a temperature of between 70° and 120° C.; and (h) then depositing a passivation layer of silicon nitride.

10. The method of claim 9 wherein at least one of said conductive layers comprises aluminum silicide.

11. The method of claim 9 wherein said heating in vacuum is performed for no longer than about 120 minutes prior to said deposition of silicon nitride.

* * * * *